(12) United States Patent
Lee (10) Patent No.: US 7,407,409 B2
(45) Date of Patent: Aug. 5, 2008

(54) FLEXIBLE PRINTED CIRCUIT CONNECTOR, FLEXIBLE PRINTED CIRCUIT INSERTED INTO THE SAME, AND DISPLAY DEVICE HAVING THE SAME, AND METHOD THEREOF

(75) Inventor: Min Su Lee, Yongsan-gu (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/485,211

(22) Filed: Jul. 12, 2006

(65) Prior Publication Data

US 2007/0128922 A1  Jun. 7, 2007

(30) Foreign Application Priority Data

Dec. 1, 2005 (KR) .................. 10-2005-0116078

(51) Int. Cl.
*H01R 12/24* (2006.01)

(52) U.S. Cl. ..................................... 439/495

(58) Field of Classification Search ............... 439/495, 439/493
See application file for complete search history.

(56) References Cited

U.S. PATENT DOCUMENTS 5,775,938 A * 7/1998 Noro et al. .............. 439/495
6,254,413 B1 * 7/2001 Yasui et al. ............. 439/260
7,198,519 B2 * 4/2007 Regnier et al. ........... 439/637
7,232,315 B2 * 6/2007 Uchida et al. ............ 439/67
7,281,943 B1 * 10/2007 Yamaji et al. ............ 439/495

FOREIGN PATENT DOCUMENTS

JP   WO2004098251   * 11/2004

* cited by examiner

*Primary Examiner*—Neil Abrams
*Assistant Examiner*—Phuong Nguyen
(74) *Attorney, Agent, or Firm*—Cantor Colburn LLP (57) ABSTRACT

Disclosed is a flexible printed circuit connector capable of increasing the number of connecting terminals, a flexible printed circuit capable of increasing the width of a pad terminal connected to each of the connecting terminals, a display device having the flexible printed circuit connector, and a method thereof. The display device includes a display panel displaying an image, a driving circuit driving the display panel, a printed circuit board on which a plurality of signal generators generating a driving signal supplied to the driving circuit is mounted, a connector mounted on the printed circuit board, and a flexible printed circuit inserted into the connector. The connector includes a connector housing providing a connecting port, and at least two connecting terminal groups formed separately on different surfaces within the connector housing.

19 Claims, 11 Drawing Sheets

FIG.1A

PRIOR ART

FIG.1B

PRIOR ART

FLEXIBLE PRINTED CIRCUIT CONNECTOR, FLEXIBLE PRINTED CIRCUIT INSERTED INTO THE SAME, AND DISPLAY DEVICE HAVING THE SAME, AND METHOD THEREOF

This application claims priority to Korean Patent Application No. 2005-116078, filed on Dec. 1, 2005 and all the benefits accruing therefrom under 35 U.S.C. §119, and the contents of which in its entirety are herein incorporated by reference.

BACKGROUND OF THE INVENTION.

1. Field of the Invention

The present invention relates to a flexible printed circuit connector, a flexible printed circuit inserted into the same, a display device having the same, and a method thereof, and more particularly, to a flexible printed circuit connector capable of increasing the number of connecting terminals, a flexible printed circuit capable of increasing the width of a pad terminal connected to each of the connecting terminals, a display device having the flexible printed circuit connector, and a method of connecting the flexible printed circuit to the flexible printed circuit connector.

2. Description of the Related Art

In order to provide a thin, small and lightweight liquid crystal display ("LCD") device, each element constituting the LCD device, for example, a backlight, a connector, a printed circuit board ("PCB"), or a coupling structure, has been studied.

The LCD device includes an LCD panel, a backlight assembly for providing light to the LCD panel, and a driving circuit for generating various signals needed to achieve an image.

The driving circuit includes a gate driver for driving the LCD panel, a data driver, a timing controller for controlling the gate driver and the data driver, and a power source.

The timing controller and the power source are mounted on a control PCB to supply control signals and driving voltages to the gate driver and the data driver.

The gate driver and the data driver are integrated into a plurality of integrated circuits ("IC"s). Each of the data driver IC and the gate driver IC is mounted on a tape carrier package ("TCP") and the TCPs are connected to the LCD panel. The gate and data driver ICs receive the control signals and driving voltages from the control PCB through signal lines formed on a data PCB connected to the TCP.

The control PCB and the data PCB are connected to each other through respective PCB connectors formed thereon. Since the PCB connector has a two-column array structure, there are many connectable terminals in relation to the occupied area. However, since the connector is mounted on both PCBs with male and female forms, it has a relatively high height or thickness.

The control PCB and the data PCB are connected to each other in such a manner that a flexible printed circuit ("FPC") attached to either of the two PCBs is connected to a connector formed on the other PCB. In this case, since the FPC connector into which the FPC is inserted is mounted on only one of the PCBs, it has less constraint in height than the PCB connector but has a small number of connecting terminals in relation to an area occupied by the PCB.

Figure 1A:
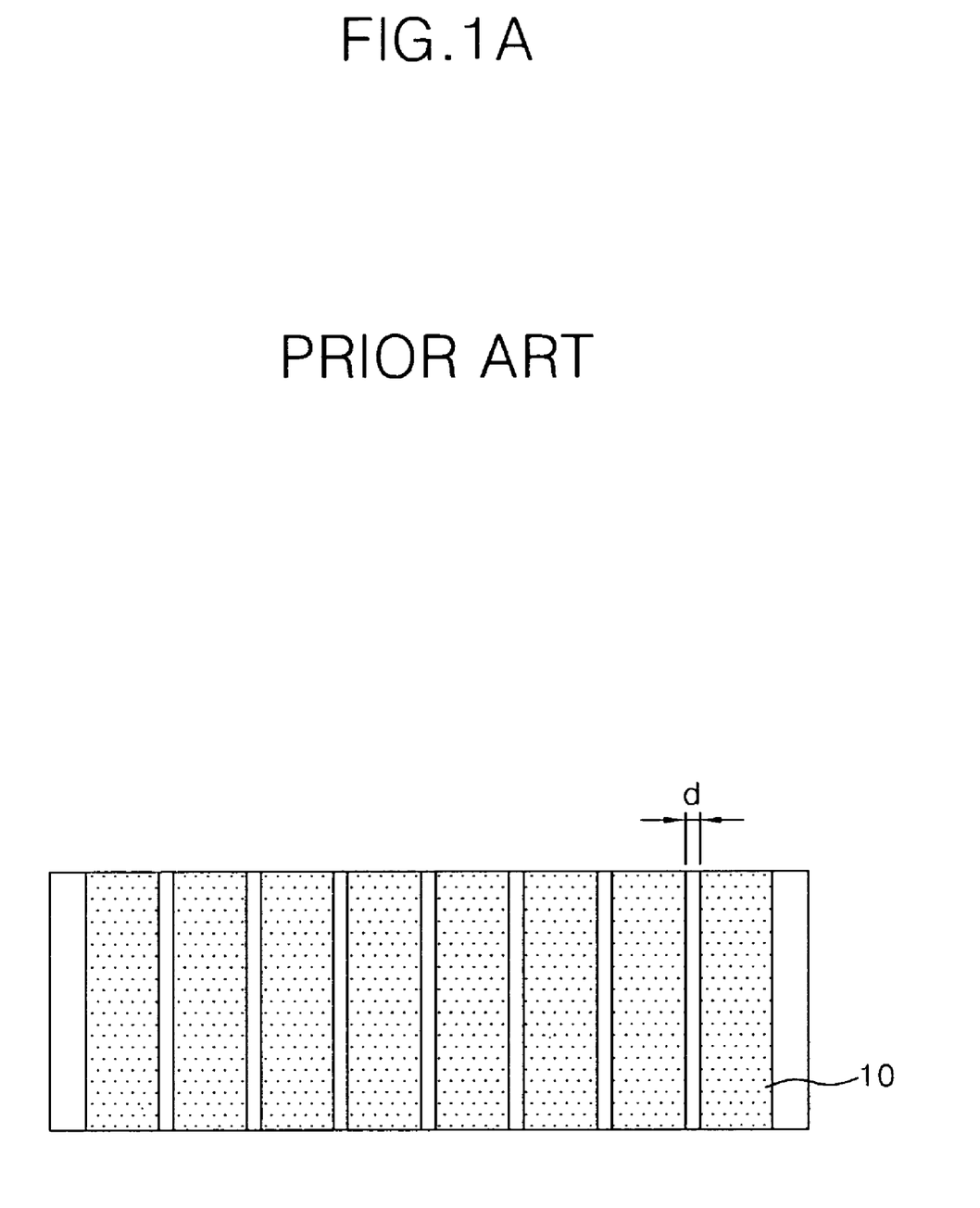
FIGS. 1A and 1B are plan views of connecting terminals of a connector according to the prior art.
Figure 1B:
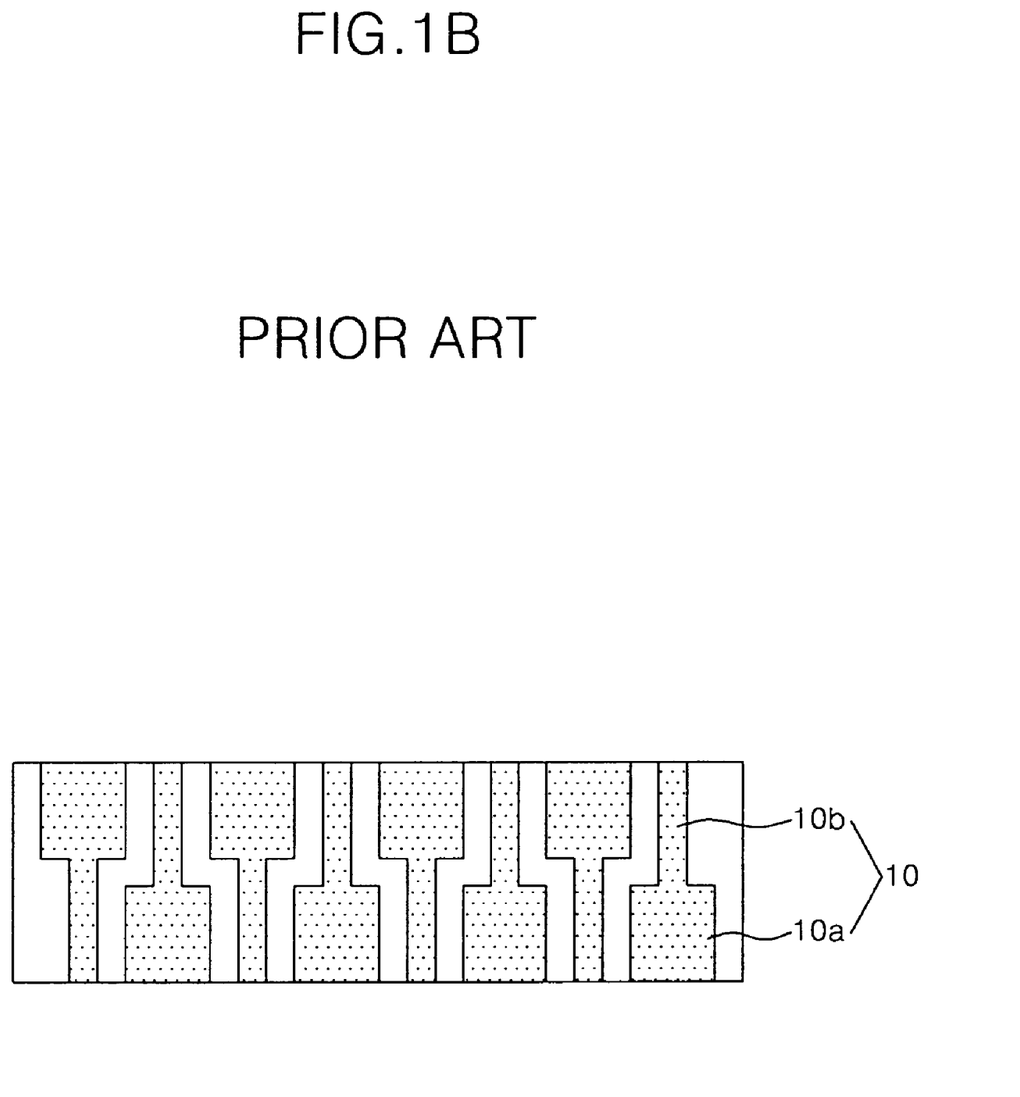

In order to solve such a problem, as shown in FIG. 1A, a method has been proposed to increase the number of connecting terminals 10 in a connector by reducing a distance d between the connecting terminals 10. Another proposed method, as shown in FIG. 1B, is to differently array the widths of first and second connecting parts 10a and 10b of each of the connecting terminals 10 and to alternately array the first and second connecting parts 10a and 10b. However, in the structures shown in FIGS. 1A and 1B, the distance between the connecting terminals 10 becomes narrow and a coating layer formed at each of the connecting terminals 10 is grown, thereby generating a short between adjacent connecting terminals 10. Moreover, since the distance between the connecting terminals 10 of the connector is narrow, an align defect occurs between a corresponding connecting terminal and an FPC pad terminal.

BRIEF SUMMARY OF THE INVENTION

Exemplary embodiments of the present invention therefore provide an FPC connector capable of increasing the number of connecting terminals, an FPC capable of increasing the width of a pad terminal connected to each of the connecting terminals, and a display device having the FPC connector.

In accordance with exemplary embodiments of the present invention, there is provided a connector for use with an FPC, including a connector housing providing a connecting port, and at least two connecting terminal groups separately formed on different surfaces within the connector housing. The different surfaces may not be coplanar.

The at least two connecting terminal groups may include a first connecting terminal group formed at an inner face of a first surface of the connector housing, and a second connecting terminal group formed at an inner face of a second surface of the connector housing, the first surface of the connector housing opposed to the second surface of the connector housing. The second connecting terminal group may face the first connecting terminal group.

The first surface of the connector housing may be substantially parallel to the second surface of the connector housing.

The connector housing may include side surfaces connecting the first surface of the second surface.

The connector may further include first lead terminals extending from the first connecting terminal group and second lead terminals extending from the second connecting terminal group, wherein the connector housing is disposed between exterior portions of the first lead terminals and the second lead terminals.

The at least two connecting terminal groups may include a first connecting terminal group formed at an inner face of a first surface of the connector housing, and a second connecting terminal group formed alternately with the first connecting terminal group at an inner face of a second surface of the connector housing.

The connector may further include a cover housing installed at one side of the connector housing. The cover housing may be pivotal with respect to a first surface of the connector housing on which one of the connecting terminal groups is formed.

In accordance with other exemplary embodiments of the present invention, an FPC inserted into an FPC connector including at least two connecting terminal groups formed separately on different surfaces within a connecting housing providing a connecting port, includes at least two pad terminal groups connected respectively to the at least two connecting terminal groups.

The at least two pad terminal groups may include a first pad terminal group formed at an upper surface of a base film so as to be connected to a first connecting terminal group formed at an inner face of a first surface of the connector housing, and a second pad terminal group formed at a lower surface of the base film so as to be connected to a second connecting terminal group facing the first connecting terminal group at an inner face of a second surface of the connector housing.

The at least two connecting terminal groups may include a first pad terminal group formed at an upper surface of a base film so as to be connected to a first connecting terminal group formed at an inner face of a first surface of the connector housing, and a second pad terminal group formed alternately with the first pad terminal group at a lower surface of the base film so as to be connected to a second connecting terminal group formed alternately with the first connecting terminal group at an inner face of a second surface of the connector housing.

In accordance with still other exemplary embodiments of the present invention, there is provided a display device, including a display panel displaying an image, a driving circuit driving the display panel, a printed circuit board on which a plurality of signal generators generating a driving signal supplied to the driving circuit is mounted, a connector mounted on the printed circuit board, and a flexible printed circuit inserted into the connector, wherein the connector includes a connector housing providing a connecting port, and at least two connecting terminal groups formed separately on different surfaces within the connector housing.

In accordance with still other exemplary embodiments of the present invention, there is provided a method of connecting a flexible printed circuit to a flexible printed circuit connector, the method including inserting a base film carrying a first pad terminal group on an upper surface of the base film and a second pad terminal group on a lower surface of the base film into a connecting port of a connector housing of the connector, connecting the first pad terminal group to a first connecting terminal group formed on an inner surface of a first surface of the connector housing, and connecting the second pad terminal group to a second connecting terminal group formed on an inner surface of a second surface of the connector housing.

The first pad terminal group and the second pad terminal group may be substantially simultaneously connected to the first connecting terminal group and the second connecting terminal group, respectively.

BRIEF DESCRIPTION OF THE DRAWINGS

The above and other features and advantages of the present invention will become more apparent from the following detailed description when taken in conjunction with the accompanying drawings in which.

DETAILED DESCRIPTION OF THE INVENTION

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in detail with reference to the accompanying drawings, with reference to FIGS. 2 to 9.

Figure 2:
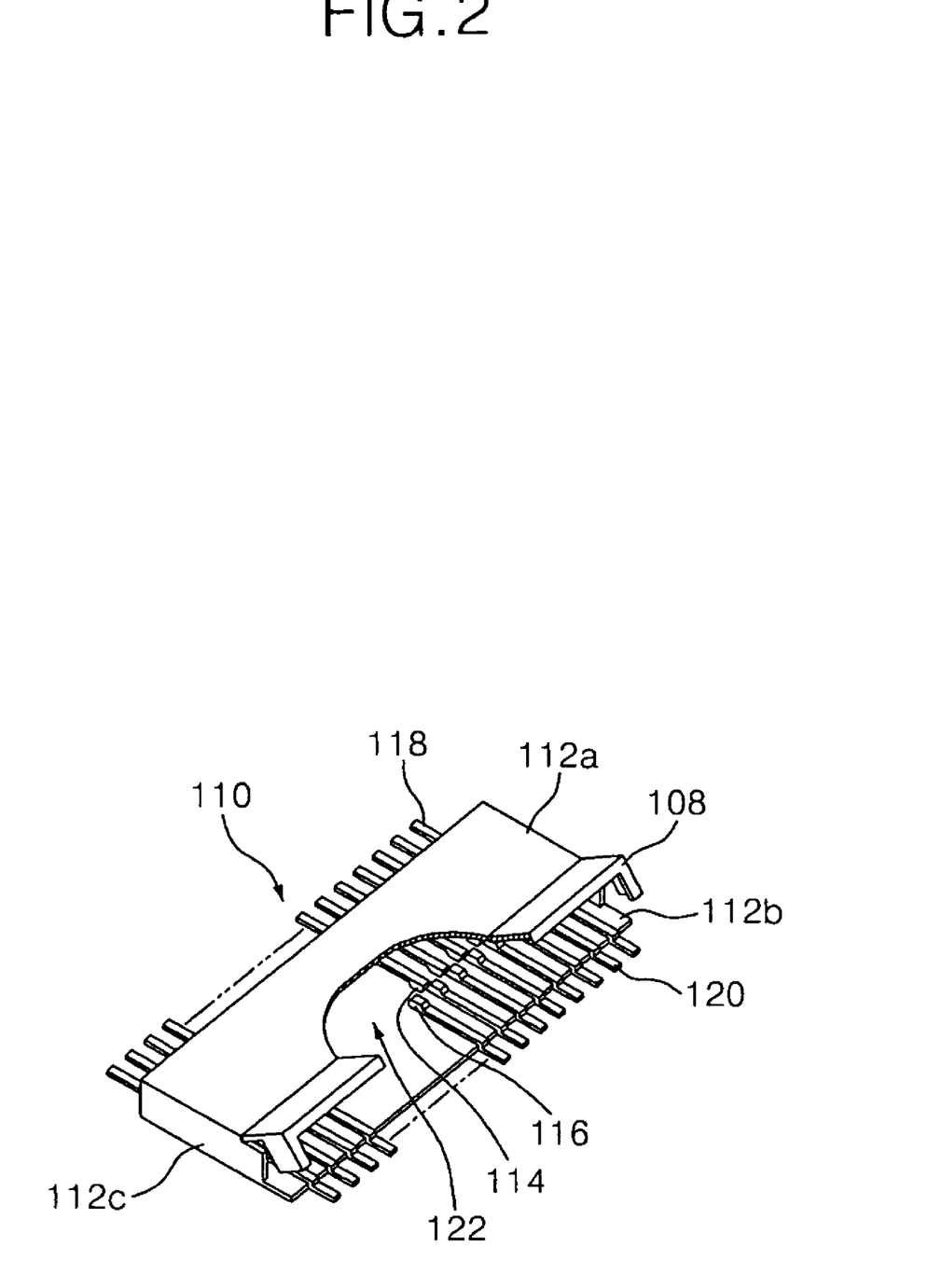
FIG. 2 is a perspective view of an exemplary FPC connector according to a first exemplary embodiment of the present invention.
Figure 3:
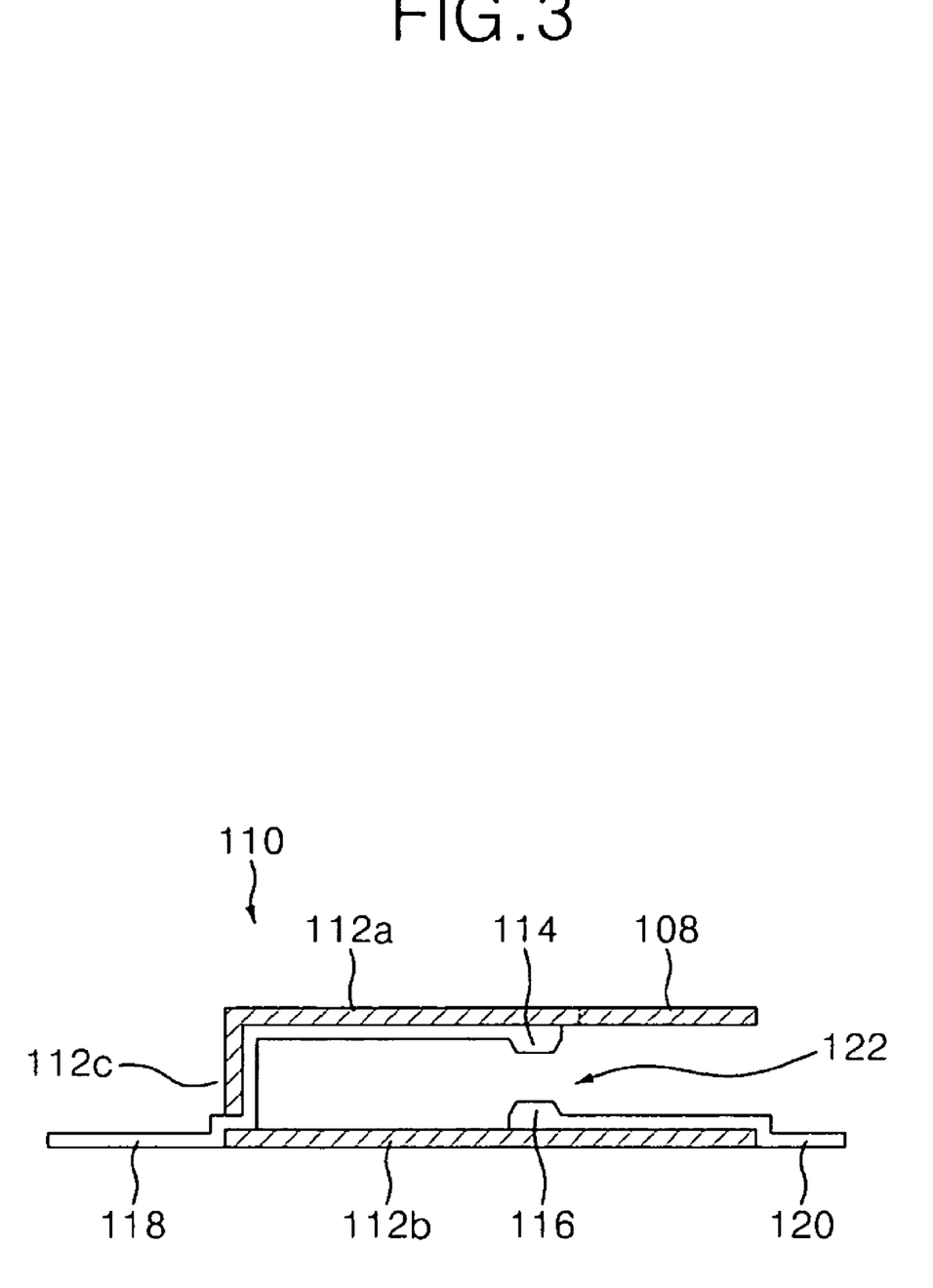
FIG. 3 is a cross-sectional view of the exemplary embodiment of the FPC connector shown in FIG. 2.

FIG. 2 is a perspective view of an exemplary connector according to a first exemplary embodiment of the present invention, and FIG. 3 is a cross-sectional view of the exemplary connector of FIG. 2.

A connector 110 shown in FIGS. 2 and 3 includes a connector housing having an upper surface 112a, a lower surface 112b facing the upper surface 112a, and a side surface 112c. The side surface 112c may include first and second opposing side surfaces connecting edges of the lower surface 112b to the upper surface 112a, and may include a third side surface extending from the upper surface 112a towards the lower surface 112b on a rear side of the connector housing. The connector housing provides a connecting port 122, with access gained from a front side of the connector housing. An inner face of the lower surface 112b and an inner face of the upper surface 112a face the connecting port 122, while an outer face of the lower surface 112b and an outer face of the upper surface 112a form part of an exterior surface of the connector 110. The connector 110 also includes a plurality of first and second connecting terminals 114 and 116 formed within the connector housing, and a cover housing 108 formed at one end of the connector housing 112. The connector 110 may be an FPC connector mounted directly on or integrated with a control PCB or a data PCB.

The connecting port 122 is provided between the upper surface 112a and the lower surface 112b, and in particular, between the inner face of the upper surface 112a and an inner face of the lower surface 112b. An FPC connected to a PCB is inserted into the connecting port 122 provided within the connector housing.

The first and second connecting terminals 114 and 116 face each other within the connecting port 122.

The first connecting terminal 114 is formed in large numbers, including a plurality of connecting terminals, on the inner face of the upper surface 112a of the connector housing and constitutes a first connecting terminal group. The first connecting terminal 114 is connected to a first pad terminal formed at an upper surface of the FPC, as will be described below with respect to FIG. 4. The second connecting terminal 116 is formed in large numbers, including a plurality of connecting terminals, on the inner face of the lower surface 112b of the connector housing and constitutes a second connecting terminal group. The second connecting terminal 116 is spaced from and faces the first connecting terminal 114 and the second connecting terminal 116 is connected to a second pad terminal formed at a lower surface of the FPC, as will be described below with respect to FIG. 4. In other words, the second connecting terminal 116 is aligned in a linear direction with the first connecting terminal 114, where the linear direction extends from a front side to a rear side of the connector housing. First and second lead terminals 118 and 120, extended respectively from the first and second connecting terminals 114 and 116, are connected to signal lines formed on the PCB through a soldering process. The first and second lead terminals 118 and 120 face each other with the connector housing disposed there between. In other words, the first lead terminals 118 may extend from the first connecting terminals 114, along the inner face of the upper surface 112a, along an inner face of the third side surface 112c, and then in a direction away from the connector 110 from a rear side of the connector housing. The second lead terminals 120, on the other hand, may extend from the second connecting terminals 116, along the inner face of the lower surface 112b, and then in a direction away from the connector 110 from a front side of the connector housing.

The cover housing 108 is rotatably supported at the connector housing and opens and closes the connecting port 122. More particularly, the cover housing 108 may be pivotal with respect to the upper surface 112a towards a front side of the connector 110.

Figure 4:
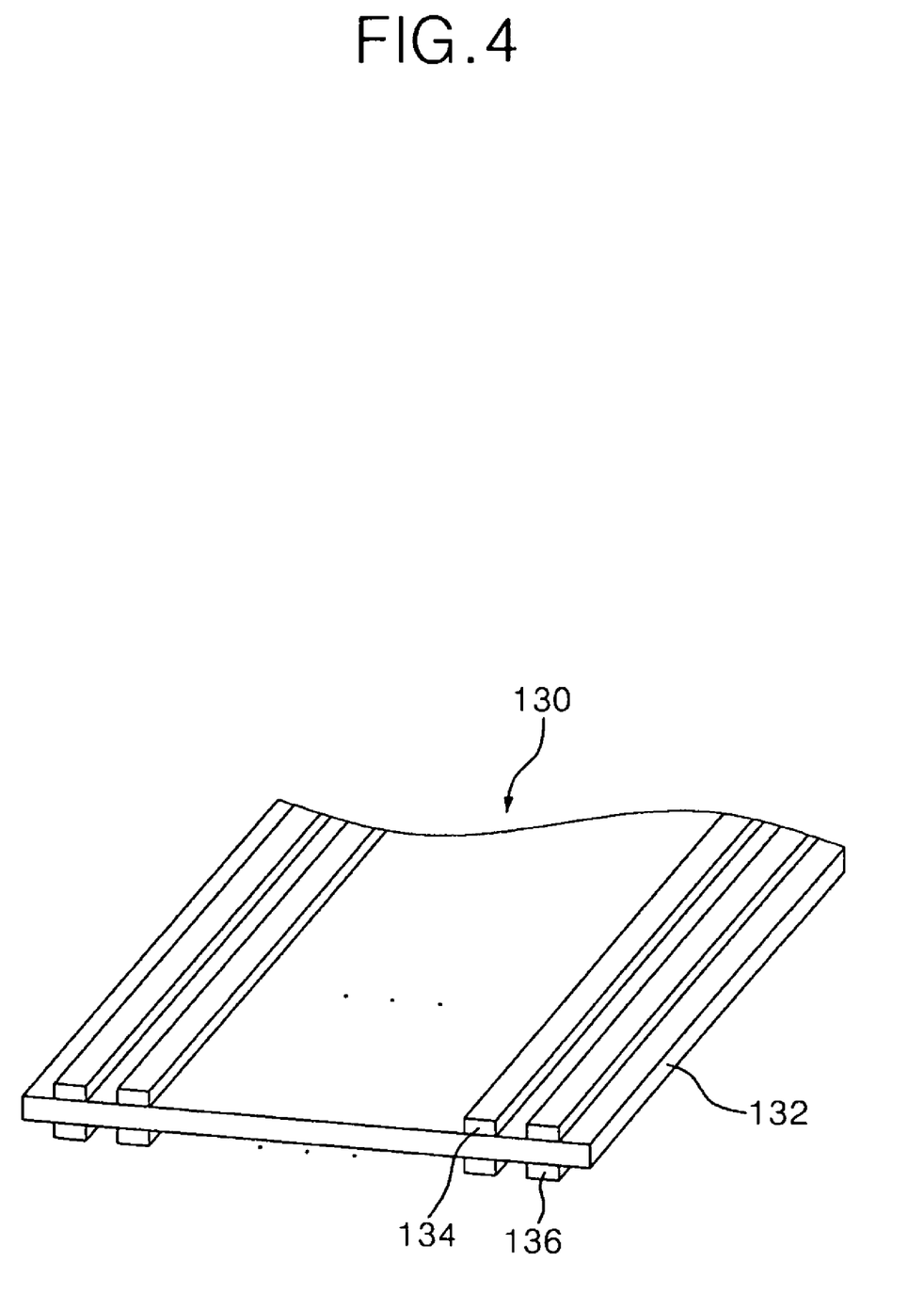
FIG. 4 is a perspective view of an exemplary FPC inserted into the exemplary embodiment of the connector shown in FIGS. 2 and 3.

As illustrated in FIG. 4, an FPC 130 inserted into the connector 110 includes first and second pad terminals 134 and 136 formed at upper and lower surfaces of a base film 132.

The first pad terminal 134 includes a plurality of pad terminals and constitutes a first pad terminal group. The second pad terminal 136 includes a plurality of pad terminals and constitutes a second pad terminal group. The first pad terminal 134 is connected to the first connecting terminal 114 of the connector 110 and the second pad terminal 136 is connected to the second connecting terminal 116 of the connector 110. The first and second pad terminals 134 and 136 are formed to face each other as shown in FIG. 4 so that they can correspond to the first and second connecting terminals 114 and 116 shown in FIGS. 2 and 3.

As described above, the connector of the first exemplary embodiment of the present invention is formed such that at least two connecting terminal groups separate from each other are formed at different surfaces within the connector housing. Therefore, an interval of each of the connecting terminal groups can be widened and the number of connecting terminals can be increased twice or more as compared to a conventional connector. Since the FPC inserted into the connector is formed such that the first and second pad terminal groups face each other with the base film disposed therebetween, the number of pad terminals can also be increased and the width of each of the pad terminals increased. Accordingly, a contact defect between the connector and the FPC is prevented.

Figure 5:
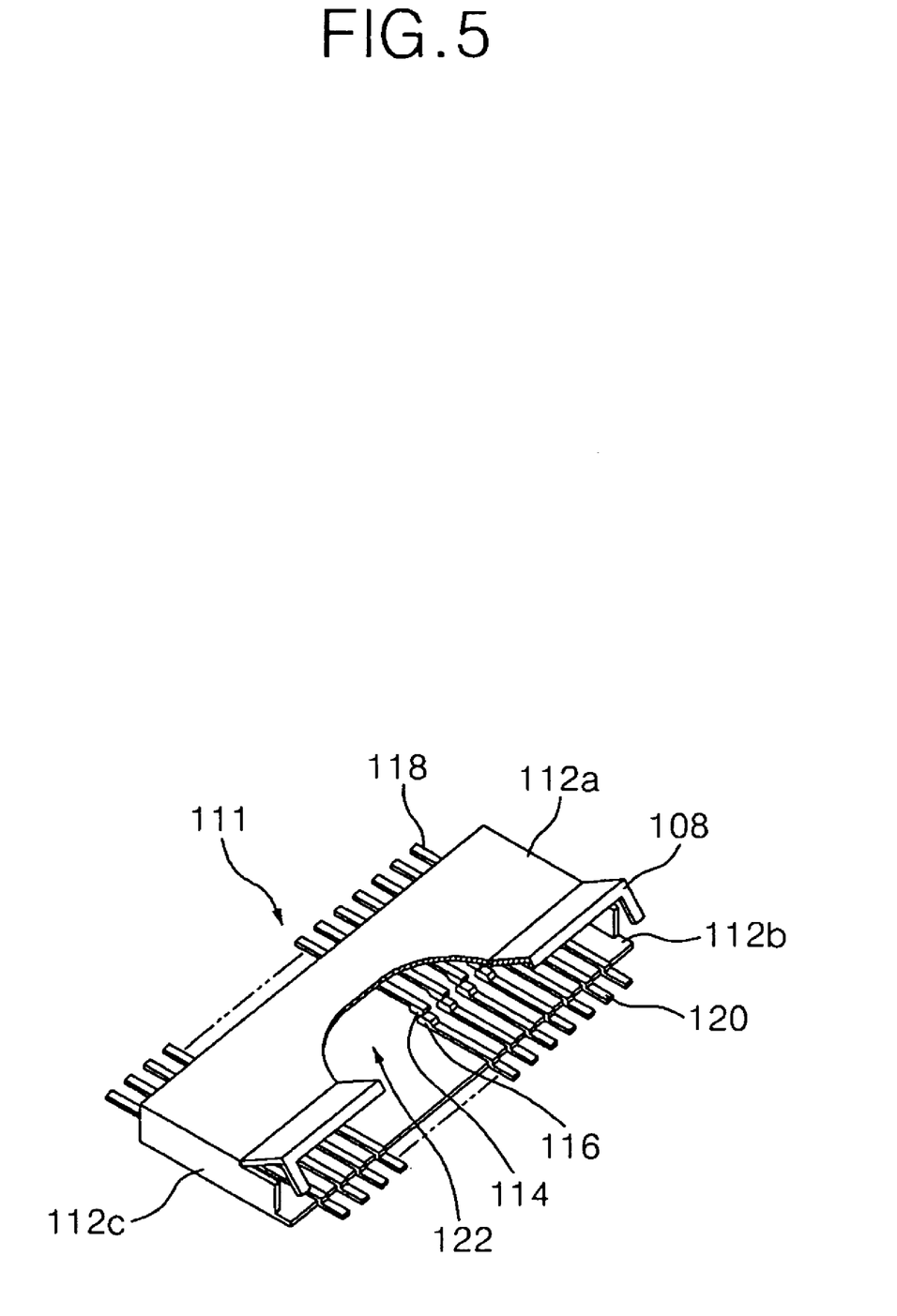
FIG. 5 is a perspective view of an exemplary FPC connector according to a second exemplary embodiment of the present invention.

FIG. 5 is a perspective view of an exemplary connector according to a second exemplary embodiment of the present invention.

The connector 111 illustrated in FIG. 5 has substantially the same construction as the connector 110 illustrated in FIG. 2 except that first and second connecting terminals are alternately formed. Therefore, a detailed description of the same constituent elements will be omitted.

First and second connecting terminals 114 and 116 are alternately formed within a connecting port 122.

The first connecting terminal 114 is formed in large numbers, including a plurality of connecting terminals, on the inner face of an upper surface 112a of a connector housing and constitutes a first connecting terminal group. The first connecting terminal 114 is connected to a first pad terminal formed at an upper surface of an FPC, as will be described below with respect to FIG. 6. The second connecting terminal 116 is formed in large numbers, including a plurality of connecting terminals, on the inner face of a lower surface 112b of the connector housing 112 and constitutes a second connecting group. The second connecting terminal 116 is spaced from and is formed between the first connecting terminals 114 and is connected to a second pad terminal formed at a lower surface of the FPC, as will be described below with respect to FIG. 6. In other words, the second connecting terminal 116 is offset in a linear direction from the first connecting terminal 114, where the linear direction extends from a front side to a rear side of the connector housing. First and second lead terminals 118 and 120, extended respectively from the first and second connecting terminals 114 and 116, are connected to signal lines formed on a PCB through a soldering process. The first and second lead terminals 118 and 120 face each other with the connector housing disposed there between. In other words, the first lead terminals 118 may extend from the first connecting terminals 114, along the inner face of the upper surface 112a, along an inner face of the third side surface 112c, and then in a direction away from the connector 111 from a rear side of the connector housing. The second lead terminals 120, on the other hand, may extend from the second connecting terminals 116, along the inner face of the lower surface 112b, and then in a direction away from the connector 111 from a front side of the connector housing.

Figure 6:
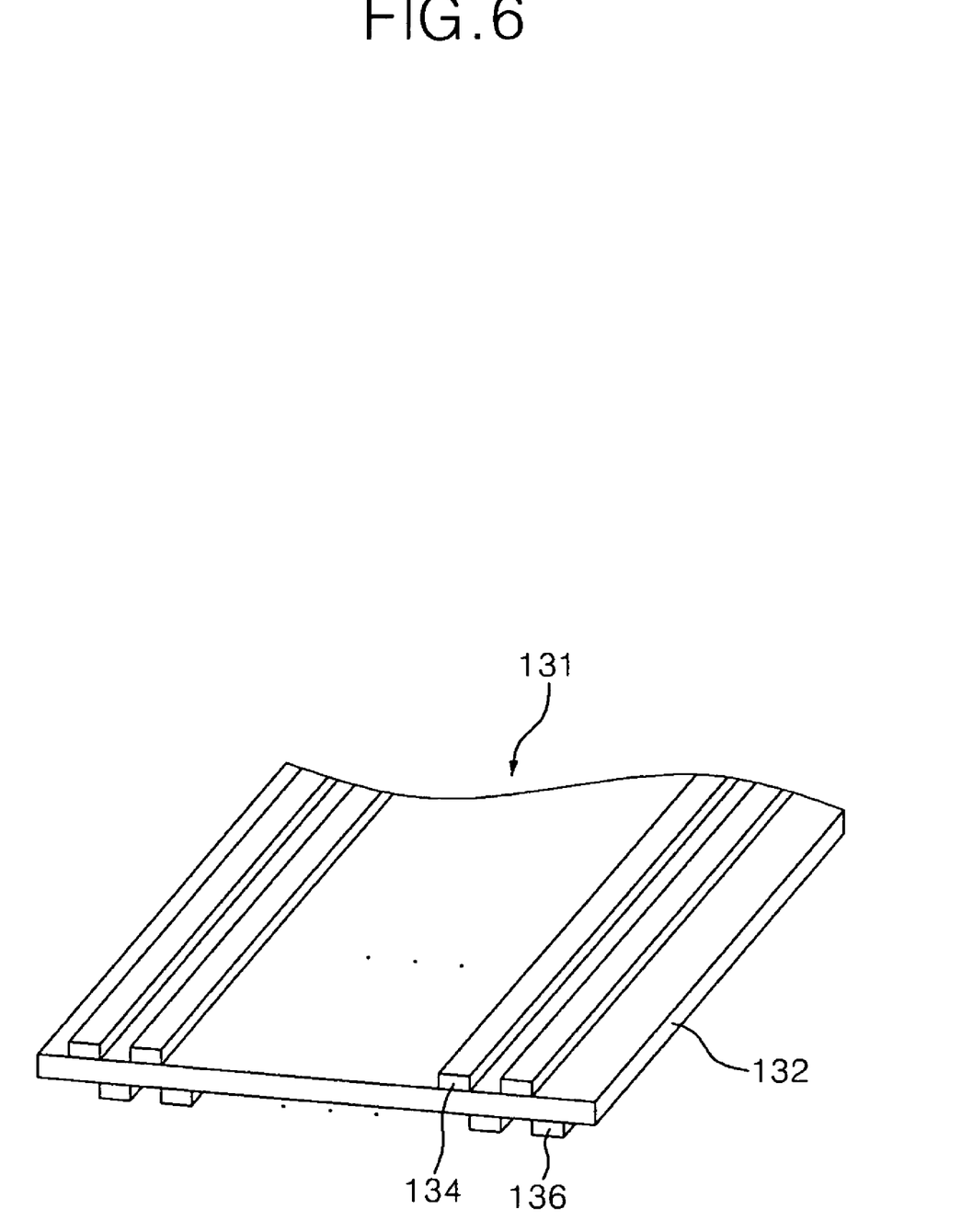
FIG. 6 is a perspective view of an exemplary FPC inserted into the exemplary embodiment of the connector shown in FIG. 5.

As illustrated in FIG. 6, an FPC 131 inserted into the above-described connector 111 includes first and second pad terminals 134 and 136 formed at upper and lower surfaces of a base film 132.

The first pad terminal 134 is connected to the first connecting terminal 114 of the connector 111. The second pad terminal 136 is connected to the second connecting terminal 116 of the connector 111 and formed at the lower surface of the base film 132 at locations corresponding to locations between the first pad terminals 134. The first and second pad terminals 134 and 136 are alternately formed with the base film 132 disposed therebetween so that they can correspond to the first and second connecting terminals 114 and 116 shown in FIG. 5. In other words, the first and second pad terminals 134 and 136 are offset from each other.

As described above, the connector of the second exemplary embodiment of the present invention is formed such that at least two connecting terminal groups separate from each other are provided on different surfaces within the connector housing. Therefore, an interval of each of the connecting terminal groups can be widened and the number of connecting terminals can be increased twice or more as compared to the conventional connector. Since the FPC inserted into the connector is formed such that the first and second pad terminals are alternately formed with the base film disposed therebetween, the number of pad terminals can be increased and the width of each of the pad terminals increased. Accordingly, a contact defect between the connector and the FPC is prevented.

Figure 7A:
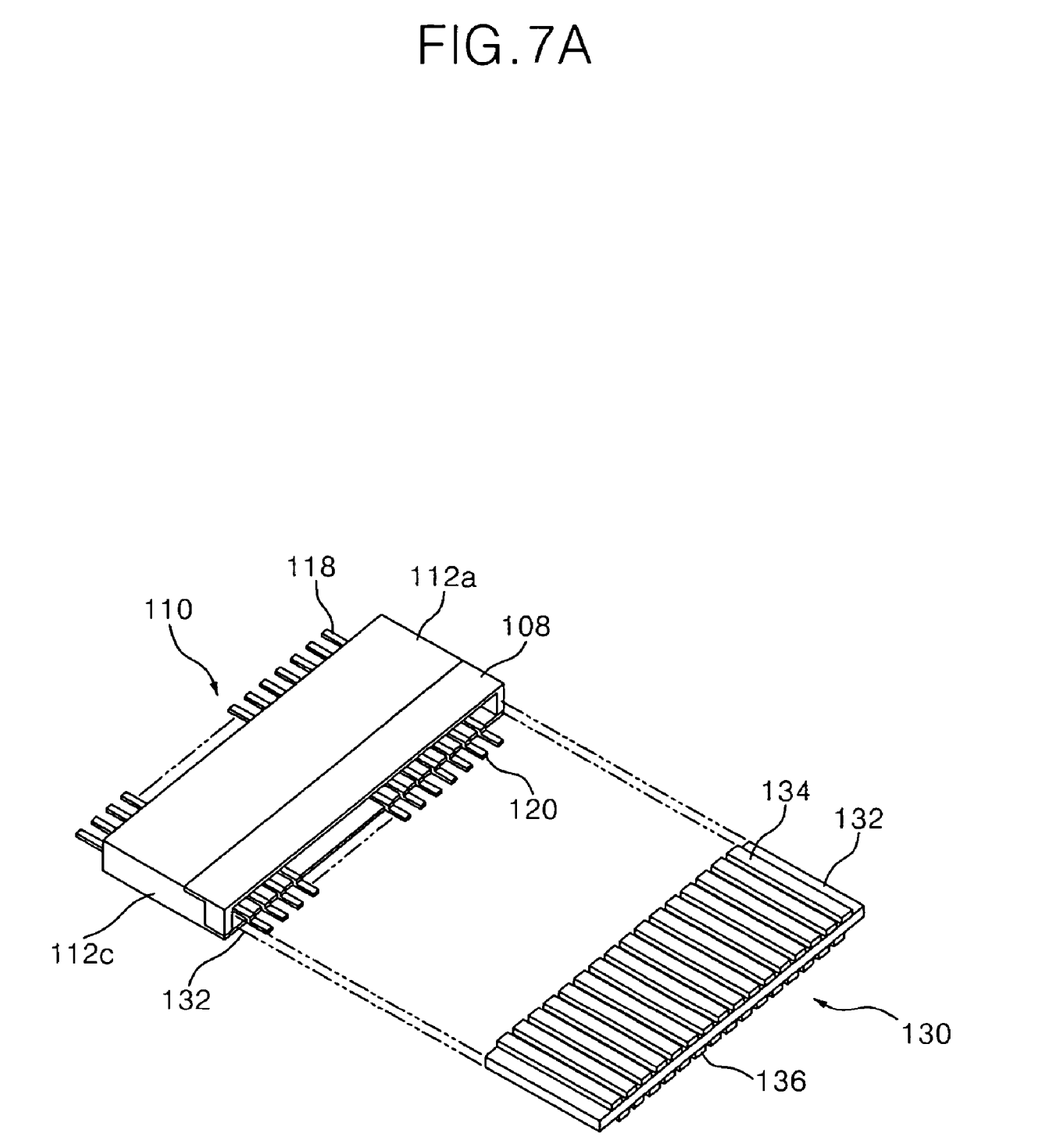
FIGS. 7A and 7B are perspective views illustrating an exemplary connecting process of an exemplary embodiment of a connector and an exemplary FPC according to the present invention.
Figure 7B:
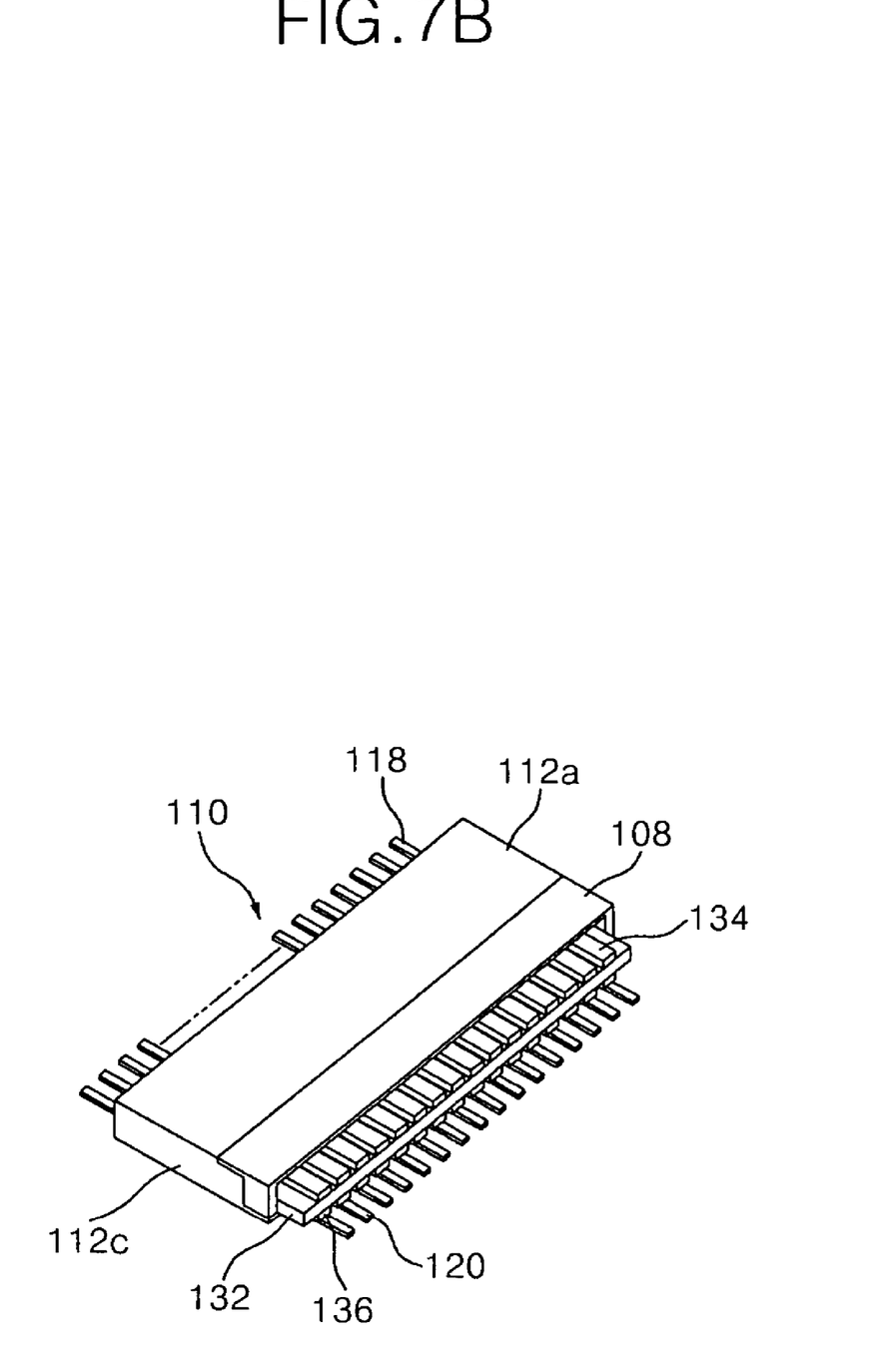

FIGS. 7A and 7B are perspective views illustrating an exemplary connecting process of an exemplary embodiment of a connector and an exemplary FPC inserted thereto. In FIGS. 7A and 7B, the connector of the first exemplary embodiment of the present invention is shown by way of example, however it should be understood that the connector of the second exemplary embodiment, as well as other exemplary embodiments within the scope of this invention, may receive an exemplary FPC in a similar manner as shown.

Referring to FIG. 7A, the connector 110 having the first and second connecting terminals 114 and 116, and the FPC 130 inserted into the connecting port 122 of the connector 110 are shown. The connector 110 is the same as that shown in FIGS. 2 and 3 and the FPC 130 is the same as that shown in FIG. 4. Therefore, a detailed description thereof will be omitted.

The FPC 130 is inserted into the connecting port 122 of the connector 110, via a front side of the connector housing, as shown in FIG. 7B. The first pad terminal 134 of the FPC 130 is connected to the first connecting terminal 114 of the connector 110, and the second pad terminal 136 of the FPC 130 is connected to the second connecting terminal 116 of the connector 110. Accordingly, a driving signal supplied through the FPC 130 is applied to a signal line of a PCB through the first and second connecting terminals 114 and 116 of the connector 110. Alternatively, a driving signal supplied through the connector 110 mounted on a first PCB is applied to a signal line of a second PCB through the FPC 130.

Figure 8:
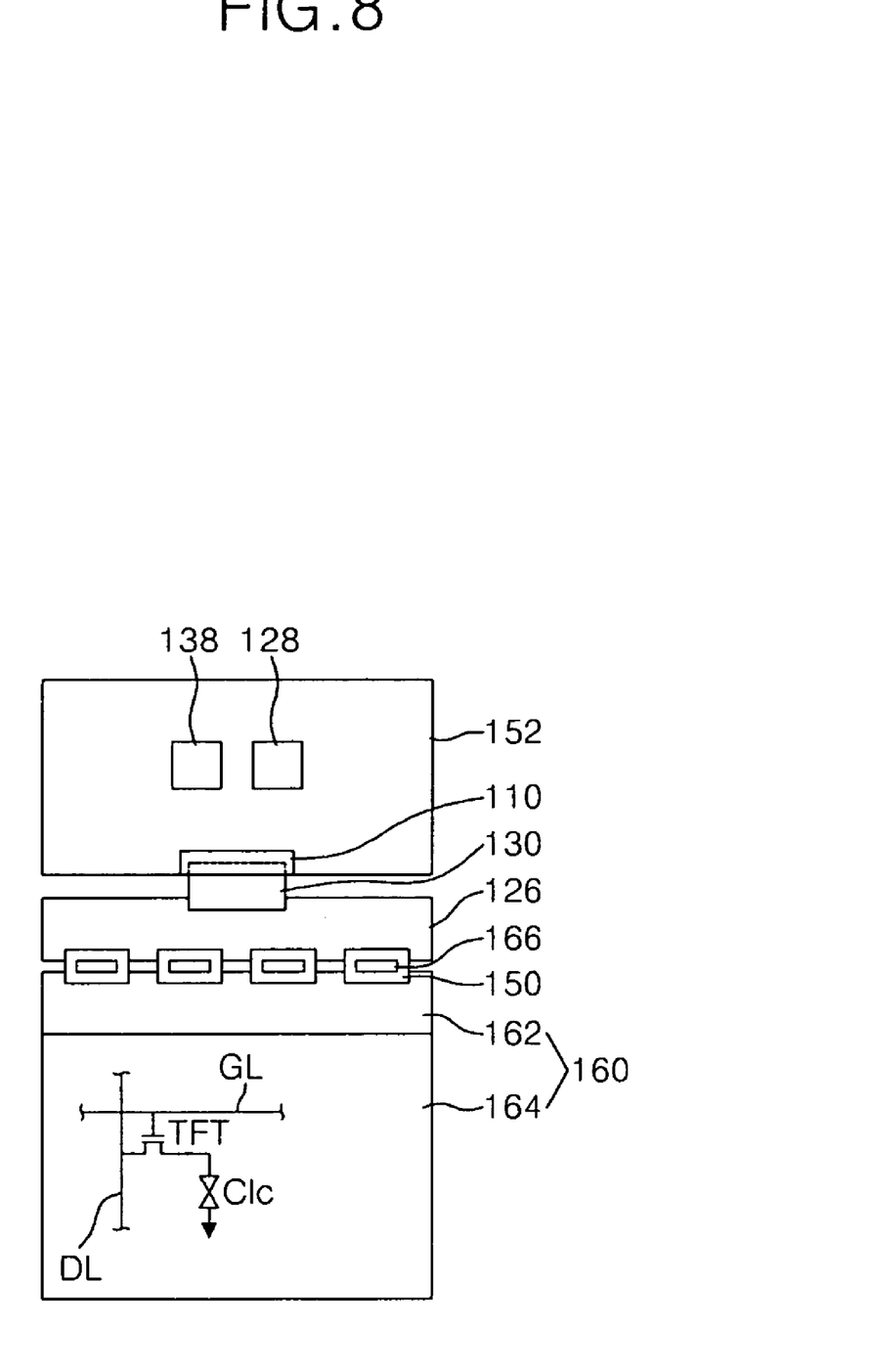
FIG. 8 is a schematic plan view of an exemplary LCD device including an exemplary embodiment of a connector and an exemplary FPC according to the present invention.
Figure 9:
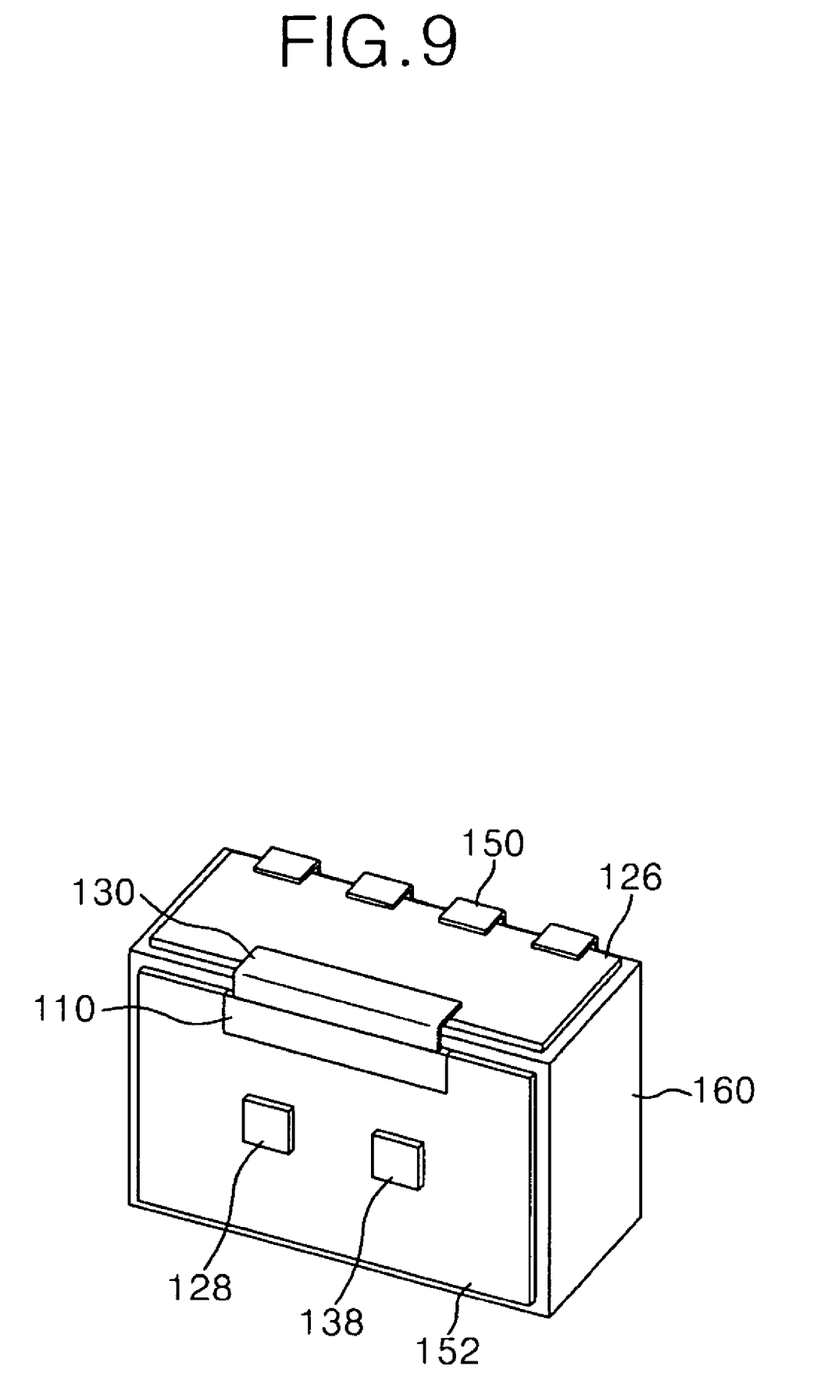
FIG. 9 is a perspective view of the exemplary LCD device shown in FIG. 8.

FIGS. 8 and 9 illustrate an exemplary LCD device having an exemplary embodiment of the connector according to the present invention.

Referring to FIGS. 8 and 9, the LCD device includes an LCD panel 160, a data PCB 126, and a control PCB 152 connected to the data PCB 126.

The LCD panel 160 is formed by assembling a thin film transistor ("TFT") substrate 162 and a color filter substrate 164 with a liquid crystal material disposed therebetween. The LCD panel 160 provides liquid crystal cells Clc driven independently by TFTs in every region defined by intersections of gate lines GL and data lines DL. Although only one gate line GL, data line DL, and TFT are shown for clarity, a plurality of gate lines GL may extend in a first direction as shown, a plurality of data lines DL may extend in a second direction as shown, where the second direction is substantially perpendicular to the first direction, and a matrix of pixel regions defined between adjacent pairs of gate lines GL and data lines DL may be formed with a TFT provided within each pixel region. The TFT supplies a pixel signal from the data line DL to the liquid crystal cell Clc in response to a scan signal from the gate line GL.

The TFT substrate 162 of the LCD panel 160 is electrically connected to the data PCB 126 through a TCP 150, or a plurality of TCPs 150 as shown, in which an integrated circuit ("IC") 166 is mounted on each TCP 150. The IC 166 includes a data IC for driving the data line DL and a gate IC for driving the gate line GL. The data IC converts pixel data into an analog pixel signal and supplies the analog pixel signal to the data lines DL. The gate IC sequentially supplies a scan signal of a gate HIGH voltage to the gate lines GL. During a period except while the gate HIGH voltage is supplied, the gate IC supplies a gate LOW voltage to the gate lines GL.

The data PCB 126 is thus connected to the TCP 150. The data PCB 126 is also connected to the control PCB 152 through the FPC connector 110 and the FPC 130. Therefore, the data PCB 126 directly supplies a control signal, a power signal, pixel data, etc. from a timing controller 128 and a power source 138 mounted on the control PCB 152 to the IC 166.

The control PCB 152 supplies a backlight power signal generated from the power source 138 to a backlight inverter. The control PCB 152 is connected to the data PCB 126 through the FPC connector 110 and the FPC 130. Hence, the control PCB 152 supplies the control signal, the power signal, the pixel data, etc. from the timing controller 128 and the power source 138 mounted on the control PCB 152 to the data PCB 126. An input power, pixel data, a clock signal, a synchronization signal, etc. from a user connector connected through a cable are supplied to the timing controller 128 and the power source 138 mounted on the control PCB 152.

The exemplary embodiments of the connector and the FPC according to the exemplary embodiments of the present invention are applicable not only to an LCD device but to other devices including other display devices, such as a plasma display panel, a field emission device, and an electroluminescent device, and to all devices having a connector and an FPC.

As apparent from the foregoing description, the FPC connector, FPC inserted into the connector and display device having the connector include the connector of which two connecting terminal groups are separately formed on the different surfaces within the connector housing.

Therefore, the inventive connector, FPC inserted into the connector and display device having the connector can increase the interval of each of the connecting terminal groups and increase the number of connecting terminals twice or more as compared to the conventional connector.

Since the FPC is formed such that the first and second pad terminal groups face each other with the base film disposed therebetween, the number of pad terminals of the FPC can be increased and the width of the pad terminal increased.

Furthermore, the inventive connector, FPC inserted into the connector and display device having the connector can prevent a contact defect between the connector and the FPC.

While the invention has been shown and described with reference to the particular illustrative embodiments thereof, it will be understood by those skilled in the art that various changes in form and details may be made therein without departing from the spirit and scope of the invention as defined by the appended claims.

What is claimed is:

1. A connector for use with a flexible printed circuit, the connector comprising:
   a connector housing providing a connecting port;
   a first connecting terminal group including a first portion extended in contact with an inner upper face of a first surface of the connector housing, and a distal end of the first portion contacting an upper surface of the flexible printed circuit; and
   a second connecting terminal group including a second portion extended in contact with an inner lower face of a second surface of the connector housing, and a distal end of the second portion contacting a lower surface of the flexible printed circuit, the first surface of the connector housing being opposed to the second surface of the connector housing;
   wherein the second connecting terminal group is connected to signal lines of a printed circuit board, and the signal lines of the printed circuit board are connected to the flexible printed circuit through the second connecting terminal group.

2. The connector as set forth in claim 1, wherein the inner faces are not coplanar.

3. The connector as set forth in claim 1, wherein the second connecting terminal group faces the first connecting terminal group.

4. The connector as set forth in claim 1, wherein the first surface of the connector housing is substantially parallel to the second surface of the connector housing.

5. The connector as set forth in claim 1, wherein the connector housing includes side surfaces connecting the first surface to the second surface.

6. The connector as set forth in claim 1, further comprising first lead terminals extending from the first connecting terminal group and second lead terminals extending from the second connecting terminal group,
   wherein the connector housing is disposed between exterior portions of the first lead terminals and the second lead terminals; and
   wherein the first lead terminals and the second lead terminals are substantially coplanar with the second surface of the connector housing.

7. The connector as set forth in claim 1, wherein the second connecting terminal group is formed alternately with the first connecting terminal group.

8. The connector as set forth in claim 1, further comprising a cover housing installed at one side of the connector housing.

9. The connector as set forth in claim 8, wherein the cover housing is pivotal with respect to a first surface of the connector housing on which one of the connecting terminal groups is formed.

10. A flexible printed circuit inserted into a flexible printed circuit connector, the flexible printed circuit comprising:
    a first pad terminal group disposed at an upper surface of a base film and connected to a first portion of a first connecting terminal group, the first portion extended in contact with an inner upper face of a first surface of a flexible printed circuit connector housing, and a distal end of the first portion contacting an upper surface of the flexible printed circuit; and
    a second pad terminal group disposed at a lower surface of the base film and connected to a second portion of a second connecting terminal group, the second portion extended in contact with an inner lower face of a second surface of the flexible printed circuit connector housing, and a distal end of the second portion contacting a lower surface of the flexible printed circuit;
    wherein the second connecting terminal group is connected to signal lines of a printed circuit board, and the signal lines of the printed circuit board are connected to the flexible printed circuit through the second connecting terminal group.

11. The flexible printed circuit as set forth in claim 10, wherein the second connecting terminal group is disposed facing the first connecting terminal group.

12. The flexible printed circuit as set forth in claim 10, wherein the second pad terminal group is disposed alternately with the first pad terminal group.

13. A display device comprising:
    a display panel displaying an image;
    a driving circuit driving the display panel;
    a printed circuit board on which a plurality of signal generators generating a driving signal supplied to the driving circuit is mounted;
    a connector mounted on the printed circuit board; and
    a flexible printed circuit inserted into the connector;
    wherein the connector includes:
       a first connecting terminal group including a first portion extended in contact with an inner upper face of a first surface of the connector housing, and a distal end of the first portion contacting an upper surface of the flexible printed circuit; and
       a second connecting terminal group including a second portion extended in contact with an inner lower face of a second surface of the connector housing, and a distal end of the second portion contacting a lower surface of the flexible printed circuit,
       wherein the first surface of the connector housing is opposed to the second surface of the connector housing, and
       wherein the second connecting terminal group is connected to the signal generators of the printed circuit board, and the driving signal from the printed circuit board is applied to the flexible printed circuit through the second connecting terminal group.

14. The display device as set forth in claim 13, wherein the second connecting terminal group is disposed facing the first connecting terminal group.

15. The display device as set forth in claim 14, wherein the flexible printed circuit compnses:
   a first pad terminal group formed at an upper surface of a base film so as to be connected to the first connecting terminal group; and
   a second pad terminal group formed at a lower surface of the base film so as to be connected to the second connecting terminal group and to face the first pad terminal group.

16. The display device as set forth in claim 13, wherein the second connecting terminal group is disposed alternately with the first connecting terminal.

17. The display device as set forth in claim 16, wherein the flexible printed circuit comprises:
   a first pad terminal group formed at an upper surface of a base film so as to be connected to the first connecting terminal group; and
   a second pad terminal group formed at a lower surface of the base film so as to be connected to the second connecting terminal group and formed alternately with the first pad terminal group.

18. A method of connecting a flexible printed circuit to a flexible printed circuit connector, the method comprising:
   inserting a base film carrying a first pad terminal group on an upper surface of the base film and a second pad terminal group on a lower surface of the base film into a connecting port of a connector housing of the connector;
   connecting the first pad terminal group to a first portion of a first connecting terminal group, the first portion extended in contact with an inner upper surface of a first surface of the connector housing, and a distal end of the first portion contacting the first pad terminal group; and
   connecting the second pad terminal group to a second portion of a second connecting terminal group, the second portion extended in contact with an inner lower surface of a second surface of the connector housing, and a distal end of the second portion contacting the second pad terminal group;
   wherein the second connecting terminal group is connected to signal lines on a printed circuit board, and the signal lines on the printed circuit board are connected to the flexible printed circuit through the second connecting terminal group.

19. The method as set forth in claim 18, wherein the first pad terminal group and the second pad terminal group are substantially simultaneously connected to the first connecting terminal group and the second connecting terminal group, respectively.

* * * * *